United States Patent (10) Patent No.: US 7,989,270 B2
Huang et al. (45) Date of Patent: Aug. 2, 2011

(54) SEMICONDUCTOR DEVICE AND METHOD OF FORMING THREE-DIMENSIONAL VERTICALLY ORIENTED INTEGRATED CAPACITORS

(75) Inventors: Rui Huang, Singapore (SG); Heap Hoe Kuan, Singapore (SG); Yaojian Lin, Singapore (SG); Seng Guan Chow, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 119 days.

(21) Appl. No.: 12/404,134

(22) Filed: Mar. 13, 2009

(65) Prior Publication Data

US 2010/0230806 A1 Sep. 16, 2010

(51) Int. Cl.
*H01L 21/00* (2006.01)
*H01L 21/20* (2006.01)

(52) U.S. Cl. ........................................ 438/127; 438/381

(58) Field of Classification Search ........................ None
See application file for complete search history.

(56) References Cited

U.S. PATENT DOCUMENTS

| | | | |
|---|---|---|---|
| 5,250,843 A | 10/1993 | Eichelberger | |
| 5,353,498 A | 10/1994 | Fillion et al. | |
| 5,841,193 A | 11/1998 | Eichelberger | |
| 6,762,937 B2 * | 7/2004 | Kimoto et al. | 361/699 |
| 6,962,872 B2 | 11/2005 | Chudzik et al. | |
| 7,619,901 B2 | 11/2009 | Eichelberger et al. | |
| 2007/0076391 A1* | 4/2007 | Hsu | 361/763 |
| 2008/0180878 A1 | 7/2008 | Wang et al. | |

* cited by examiner

*Primary Examiner* — Scott B Geyer
(74) *Attorney, Agent, or Firm* — Robert D. Atkins; Patent Law Group (57) ABSTRACT

A semiconductor device is made by forming a plurality of conductive pillars vertically over a temporary carrier. A conformal insulating layer is formed over the conductive pillars. A conformal conductive layer is formed over the conformal insulating layer. A first conductive pillar, conformal insulating layer, and conformal conductive layer constitute a vertically oriented integrated capacitor. A semiconductor die or component is mounted over the carrier. An encapsulant is deposited over the semiconductor die or component and around the conformal conductive layer. A first interconnect structure is formed over a first side of the encapsulant. The first interconnect structure includes an integrated passive device. The first interconnect structure is electrically connected to the semiconductor die or component and vertically oriented integrated capacitor. The carrier is removed. A second interconnect structure is formed over a second side of the encapsulant opposite the first side of the encapsulant.

24 Claims, 8 Drawing Sheets

SEMICONDUCTOR DEVICE AND METHOD OF FORMING THREE-DIMENSIONAL VERTICALLY ORIENTED INTEGRATED CAPACITORS

FIELD OF THE INVENTION

The present invention relates in general to semiconductor devices and, more particularly, to a semiconductor device and method of forming three-dimensional (3-D) vertically oriented integrated capacitors.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

An integrated capacitor is typically made by forming a first metal layer, forming an insulating layer over the first metal layer, and then forming a second metal layer over the insulating layer, i.e., a planar metal-insulator-metal (MIM) capacitor. The planar MIM capacitor occupies a significant amount of silicon area, particularly for large value devices such as decoupling capacitors. A discrete capacitor can be used in large value applications, but requires integration in a system-in-package (SiP) using surface mount technology (SMT), which is costly and can lower manufacturing yield.

SUMMARY OF THE INVENTION

A need exists for large value integrated passive devices without consuming large silicon area. Accordingly, in one embodiment, the present invention is a method of making a semiconductor device comprising the steps of providing a temporary carrier, depositing a seed layer over the temporary carrier, forming a plurality of conductive pillars vertically over the seed layer, forming a conformal insulating layer over the conductive pillars, and forming a conformal conductive layer over the conformal insulating layer. A first conductive pillar, conformal insulating layer, and conformal conductive layer constitute a vertically oriented integrated capacitor. The method further includes the steps of mounting a semiconductor die or component over the seed layer, depositing an encapsulant over the semiconductor die or component and around the conformal conductive layer, and forming a first interconnect structure over a first side of the encapsulant. The first interconnect structure is electrically connected to a second conductive pillar. The method further includes the steps of removing the temporary carrier, and forming a second interconnect structure over a second side of the encapsulant opposite the first side of the encapsulant.

In another embodiment, the present invention is a method of making a semiconductor device comprising the steps of providing a carrier, forming a plurality of conductive pillars vertically over the carrier, forming a conformal insulating layer over the conductive pillars, and forming a conformal conductive layer over the conformal insulating layer. A first conductive pillar, conformal insulating layer, and conformal conductive layer constitute a vertically oriented integrated capacitor. The method further includes the steps of mounting a semiconductor die or component over the carrier, depositing an encapsulant over the semiconductor die or component and around the conformal conductive layer, and forming a first interconnect structure over a first side of the encapsulant. The first interconnect structure is electrically connected to the semiconductor die or component and vertically oriented integrated capacitor.

In another embodiment, the present invention is a method of making a semiconductor device comprising the steps of providing a carrier, disposing a vertically oriented integrated capacitor over the carrier, mounting a semiconductor die or component over the carrier, and depositing an encapsulant over the semiconductor die or component and around the vertically oriented integrated capacitor.

In another embodiment, the present invention is a semiconductor device comprising a semiconductor die or component and vertically oriented integrated capacitor. An encapsulant is deposited over the semiconductor die or component and around the vertically oriented integrated capacitor. A first interconnect structure is formed over a first side of the encapsulant. The first interconnect structure is electrically connected to the semiconductor die or component and vertically oriented integrated capacitor. A second interconnect structure is formed over a second side of the encapsulant opposite the first side of the encapsulant.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the semiconductor material conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
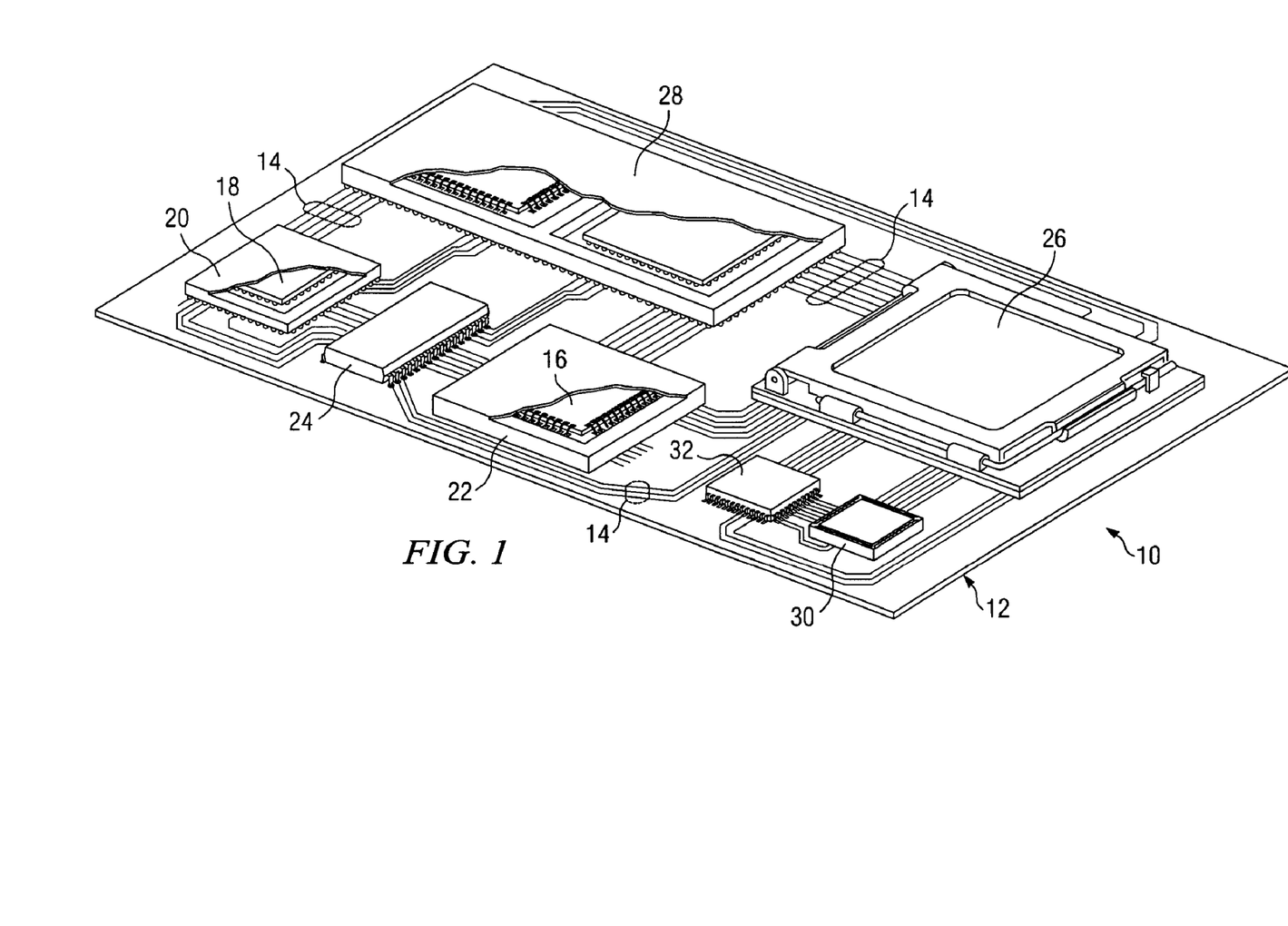
FIG. 1 illustrates a printed circuit board (PCB) with different types of packages mounted to its surface.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed over a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in lower costs for consumers.

Figure 2A:
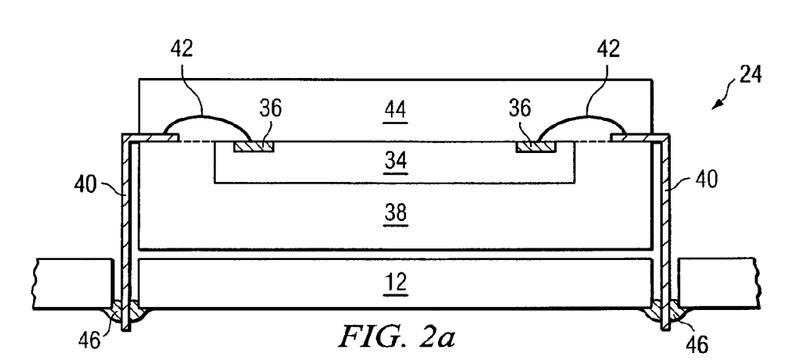
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
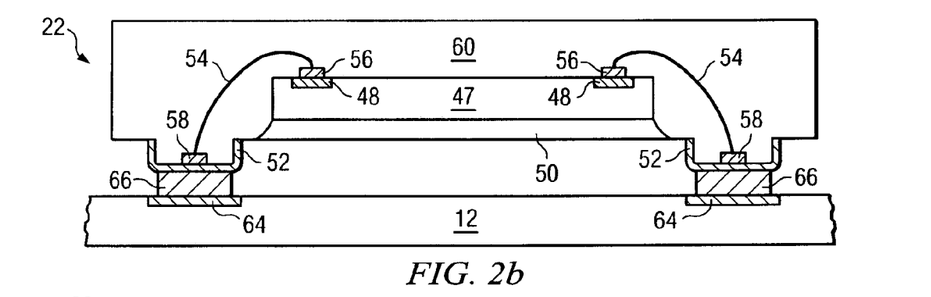

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed over a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
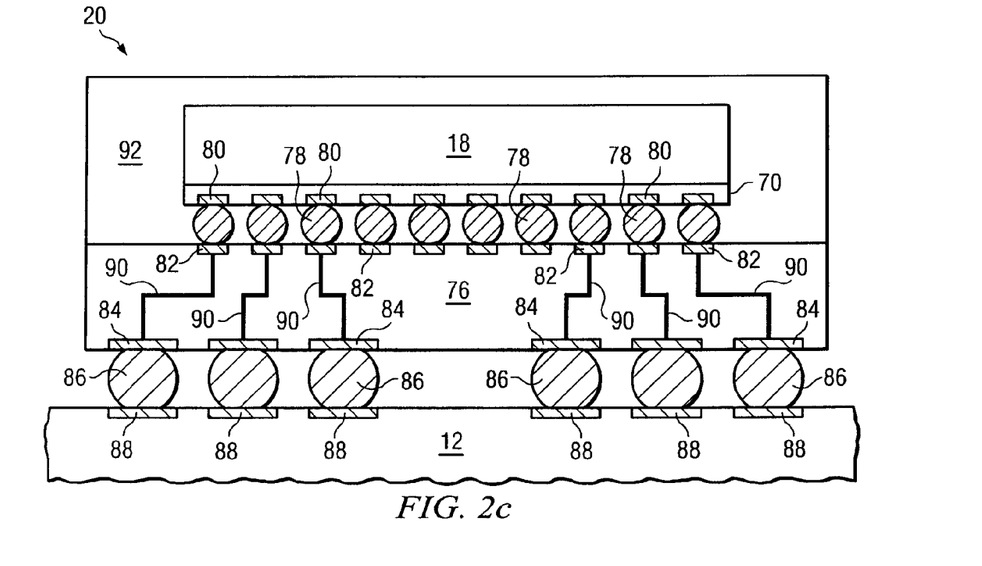

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed over bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed over bump pads or interconnect sites 84. The bump pads 84 are electrically connected to interconnect sites 82 through conductive lines 90 routed through carrier 76. Contact pads 88 are formed over a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and improve overall circuit performance. In another embodiment, the semiconductor die 18 can be mechanically and electrically attached directly to PCB 12 using flip chip style first level packaging without carrier 76.

Figure 3A:
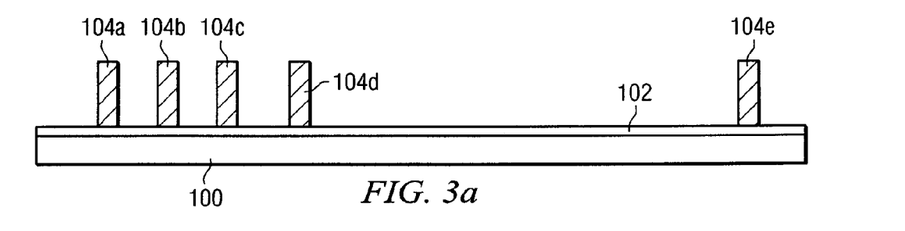
FIGS. 3a-3g illustrate a process of forming a 3-D vertically oriented integrated capacitor in a semiconductor package.

FIGS. 3a-3g illustrate a process of forming a three dimensional (3-D) vertically oriented integrated capacitor in a semiconductor package. In FIG. 3a, a temporary substrate or carrier 100 contains dummy or sacrificial base material such as silicon, polymer, polymer composite, metal, ceramic, glass, glass epoxy, beryllium oxide, or other suitable low-cost, rigid material or bulk semiconductor material for structural support.

A seed layer 102 is applied to carrier 100 with heat or light releasable temporary bonding film. Seed layer 102 can be Cu or other metal thin film with wet etching selectivity. Seed layer 102 is deposited using lamination, PVD, CVD, electrochemical deposition. Seed layer 102 can be a temporary bonding film or etch-stop layer.

A plurality of conductive pillars or posts 104a-104e is formed over seed layer 102. To form conductive pillars 104, a photoresist layer is deposited over seed layer 102. A portion of photoresist layer is exposed and removed by an etching development process. Conductive pillars 104a-104e are formed in the removed portion of photoresist using an electrolytic plating, electroless plating, or selective plating process. Conductive pillars 104 can be Cu, Al, tungsten (W), Au, solder, or other suitable electrically conductive material. Conductive pillars 104 have a height ranging from 20-200 micrometers (μm). In one embodiment, pillars 104 are 50-100 μm in height. The photoresist is stripped away leaving behind individual conductive pillars 104a-104e. Optionally, another barrier thin film layer can be deposited on pillars 104.

Figure 3B:
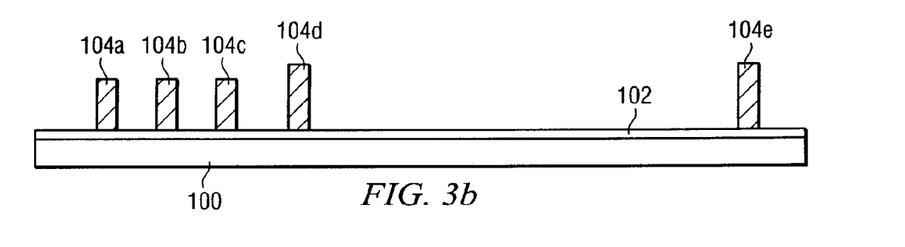

In FIG. 3b, a portion of conductive pillars 104a-104c is removed by an etching process, grinding process, or blade cutting or grinding. Conductive pillars 104a-104c are reduced in vertical profile by typically 20-50 μm after the etching process or grinding process. The vertical profile of conductive pillars 104d-104e remains unchanged. Alternatively, the different height between 104a-104c and 104d-104e can be carried out by step-lithography and plating process.

Figure 3C:
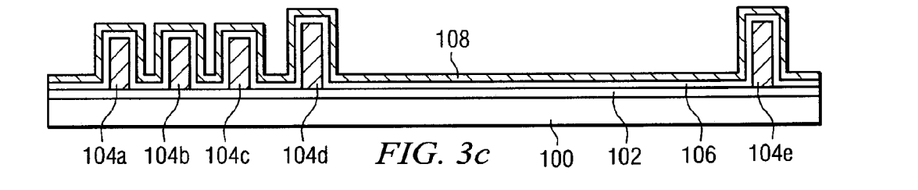

In FIG. 3c, a dielectric layer 106 is conformally applied over conductive pillars 104a-104e and seed layer 102. The conformal dielectric layer 106 can be SiO2, Si3N4, SiON, tantalum pentoxide (Ta2O5), aluminum oxide (Al2O3), polyimide, benzocyclobutene (BCB), polybenzoxazoles (PBO), or other material having electrical insulating properties. The dielectric layer 106 is patterned or blanket deposited using PVD, CVD, printing, spray coating, spin coating, sintering, thermal oxidation, or lamination. The dielectric layer 106 can be single or multiple layers.

An electrically conductive layer 108 is patterned and conformally deposited over dielectric layer 106. Conductive layer 108 is formed using PVD, CVD, electrolytic plating, electroless plating process, or other suitable metal deposition process. Conductive layer 108 can be one or more layers of Al, Cu, Sn, Ni, Au, Ag, or other suitable electrically conductive material. Note that the vertical profile of conductive pillars 104a-104c with conformal dielectric layer 106 and conductive layer 108 remains less than the vertical profile of conductive pillars 104d-104e with conformal dielectric layer 106 and conductive layer 108.

Figure 3D:
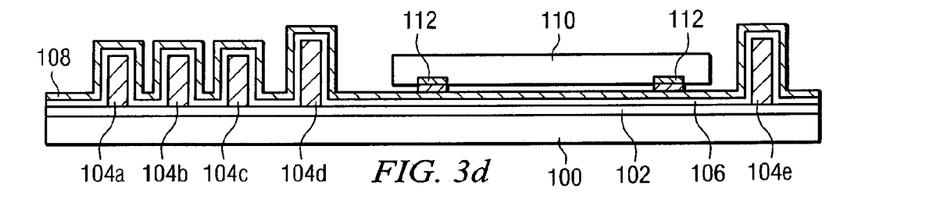

In FIG. 3d, semiconductor die 110 is mounted to conductive layer 108 between conductive pillars 104d and 104e. Semiconductor die 110 includes analog or digital circuits implemented as active and passive devices, conductive layers, and dielectric layers formed over its active surface and electrically interconnected according to the electrical design of the die. For example, the circuit may include one or more transistors, diodes, and other circuit elements formed within the active surface to implement baseband digital circuits, such as digital signal processor (DSP), memory, or other signal processing circuit. The semiconductor die may also contain IPD, such as inductors, capacitors, and resistor, for RF signal processing. In another embodiment, a passive component can be mounted to conductive layer 108 between conductive pillars 104d-104e.

Figure 3E:
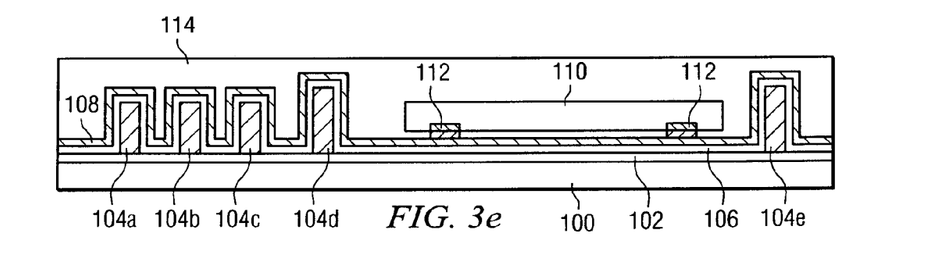

FIG. 3e shows an encapsulant or molding compound 114 deposited over semiconductor die 110 and conductive layer 108 using a paste printing, compressive molding, transfer molding, liquid encapsulant molding, vacuum lamination, or other suitable applicator. Encapsulant 114 can be polymer composite material, such as epoxy resin with filler, epoxy acrylate with filler, or polymer with proper filler. Encapsulant 114 is non-conductive and environmentally protects the semiconductor device from external elements and contaminants.

Figure 3F:
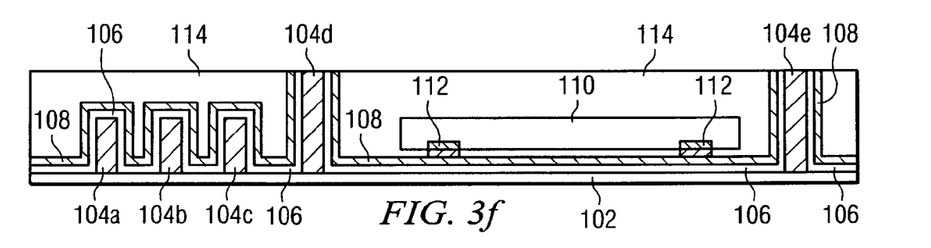

In FIG. 3f, a backgrinding process is used to remove a portion of encapsulant 114, conductive layer 108, and dielectric layer 106 to expose a top-side of conductive pillars 104d and 104e. In addition, temporary carrier 100 is released from seed layer 102 by application of heat or light. Alternatively, carrier 100 can be removed by chemical etching, mechanical peel-off, CMP, mechanical grinding, thermal bake, laser scanning, plasma etching, or other bulk material thinning process.

Figure 3G:
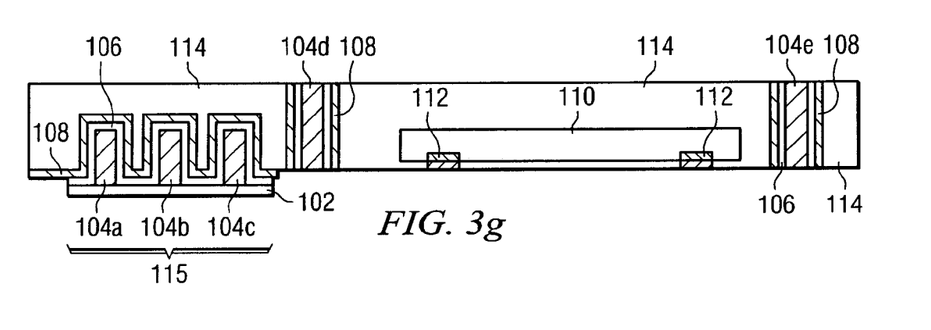

In FIG. 3g, seed layer 102, dielectric layer 106, and conductive layer 108 are selectively removed by an etching process to expose contact pads 112 of semiconductor die 110 and a bottom-side of conductive pillars 104d and 104e. Conductive pillars 104d-104e function a vertical (z-direction) interconnects extending from one side of encapsulant 114 to an opposite side of the encapsulant. A portion of conductive layer 108 over conductive pillars 104a-104c and a portion of seed layer 102 under conductive pillars 104a-104c remains in place.

Figure 4:
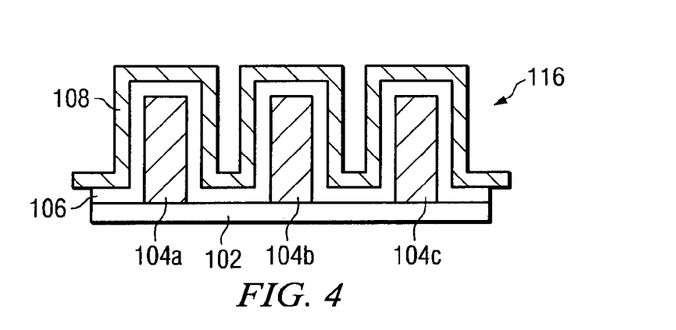
FIG. 4 illustrates further detail of the 3-D vertically oriented integrated capacitor.

FIG. 4 shows further detail of area 115 from FIG. 3g. Conductive pillars 104a-104c operates as a first metal electrode of metal-insulator-metal (MIM) vertically oriented integrated capacitors 116. Conductive layer 108 is the second metal electrode of MIM capacitor 116. Dielectric layer 106 is the intermediate insulator between the first and second metal electrodes. Conductive layer 108 extends beyond dielectric layer 106 and seed layer 102 for ready interconnect without electrically shorting to conductive pillars 104a-104c. MIM capacitor 116 is constructed in three dimensions (3-D), x- y- and z-directions. The plane parallel to the first and second capacitor electrodes is perpendicular to the plane which is parallel to the active surface of semiconductor die 110. MIM capacitor 116 extends vertically into encapsulant 114 to save die area and provide greater capacitance density. MIM capacitor 116 can have a large value, e.g. >1 nanofarad, for decoupling purposes, without the typical large foot print associated with a high value planar capacitor.

Figure 5:
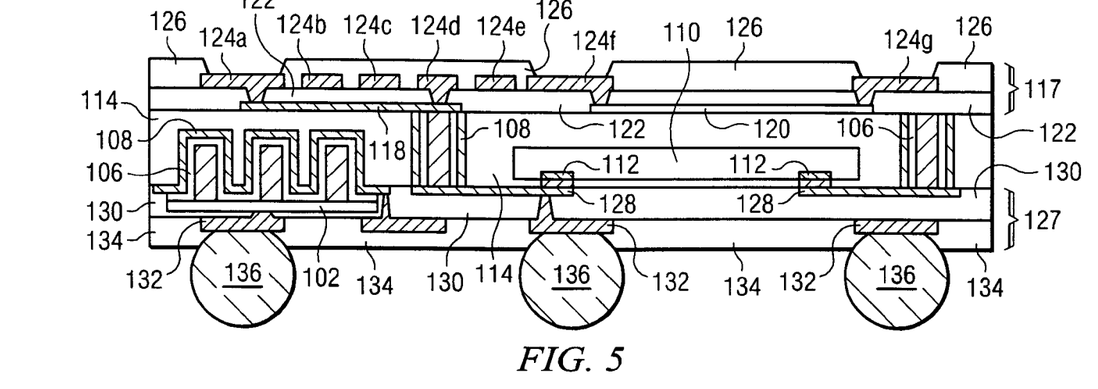
FIG. 5 illustrates the semiconductor package with the 3-D vertically oriented integrated capacitor.

In FIG. 5, an interconnect structure 117 is formed over encapsulant 114. The interconnect structure 117 includes an integrated passive device (IPD). An electrically conductive layer 118 is formed over encapsulant 114, conductive layer 108, and a topside of conductive pillar 104d using a deposition and patterning process. Conductive layer 118 is formed using PVD, CVD, electrolytic plating, electroless plating process, or other suitable metal deposition process. Conductive layer 118 can be one or more layers of Al, Cu, Sn, Ni, Au, Ag, or other suitable electrically conductive material. The first interconnect structure 117 is electrically connected to conductive pillars 104d-104e and MIM capacitor 116.

A resistive layer 120 is patterned and deposited over encapsulant 114 using PVD or CVD. Resistive layer 120 is tantalum silicide (TaxSiy) or other metal silicides, TaN, nickel chromium (NiCr), TiN, or doped poly-silicon having a resistivity between 5 and 100 ohm/sq.

An insulating or passivation layer 122 is formed over encapsulant 114, conductive layer 118, and resistive layer 120. The passivation layer 122 can be SiO2, Si3N4, SiON, Ta2O5, Al2O3, or other material having suitable insulating and structural properties. The passivation layer 122 is patterned or blanket deposited using PVD, CVD, printing, spin coating, sintering, thermal oxidation, or lamination. The passivation layer 122 can be single or multiple layers. A portion of passivation layer 122 is removed by an etching process to expose conductive layer 118 and resistive layer 120.

An electrically conductive layer 124 is formed over passivation layer 122 and conductive layer 118 using a patterning and deposition process. Conductive layer 124 includes individual portions or sections 124a-124g. Conductive layer 124 is formed using PVD, CVD, electrolytic plating, electroless plating process, or other suitable metal deposition process. Conductive layer 124 can be one or more layers of Al, Cu, Sn, Ni, Au, Ag, or other suitable electrically conductive material. The individual portions of conductive layer 124 can be electrically common or electrically isolated depending on the design and function of the semiconductor die.

An insulating or passivation layer 126 is formed over passivation layer 122 and conductive layer 124. The passivation layer 126 can be SiO2, Si3N4, SiON, Ta2O5, Al2O3, or other material having suitable insulating and structural properties. The passivation layer 126 is patterned or blanket deposited using PVD, CVD, printing, spin coating, sintering, thermal oxidation, or lamination. The passivation layer 126 can be single or multiple layers. A portion of passivation layer 126 is removed by an etching process to expose conductive layer 124.

Conductive layer 124b-124e constitute one or more IPDs 117, in this case an inductor. The conductive layer 124b-124e are typically wound or coiled in plan-view to produce or exhibit the desired inductive properties. Conductive layer 124f and 124g electrically connect to resistive layer 120 as another IPD.

The IPDs formed by conductive layer 124b-124e and resistive layer 120 provide the electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device. A typical RF system requires multiple IPDs and other high frequency circuits in one or more semiconductor packages to perform the necessary electrical functions.

The high frequency electrical devices generate or are susceptible to undesired electromagnetic interference (EMI) and radio frequency interference (RFI), or other inter-device interference, such as capacitive, inductive, or conductive coupling, also known as cross-talk. The inductor 124b-124e are vertically separated by encapsulant 114 and offset from semiconductor die 110 to reduce EMI, RFI, and other inter-device interference.

An interconnect structure 127 is formed over encapsulant 114. The interconnect structure 127 electrically connects to conductive pillars 104d-104e, semiconductor die 110, and MIM capacitor 116. The interconnect structure 127 includes an electrically conductive layer 128 formed over encapsulant 114, conductive layer 108, and the bottom-side of conductive pillars 104d-104e using a patterning and deposition process. Conductive layer 128 is formed using PVD, CVD, electrolytic plating, electroless plating process, or other suitable metal deposition process. Conductive layer 128 can be one or more layers of Al, Cu, Sn, Ni, Au, Ag, or other suitable electrically conductive material.

An insulating or passivation layer 130 is formed over encapsulant 114, seed layer 102, and conductive layer 128. The passivation layer 130 can be SiO2, Si3N4, SiON, Ta2O5, Al2O3, or other material having suitable insulating and structural properties. The passivation layer 130 is patterned or blanket deposited using PVD, CVD, printing, spin coating, sintering, thermal oxidation, or lamination. The passivation layer 130 can be single or multiple layers. A portion of passivation layer 130 is removed by an etching process to expose conductive layers 108 and 128.

An electrically conductive layer 132 is formed over passivation layer 130 and conductive layer 128 using a patterning and deposition process. Conductive layer 132 is formed using PVD, CVD, electrolytic plating, electroless plating process, or other suitable metal deposition process. Conductive layer 132 can be one or more layers of Al, Cu, Sn, Ni, Au, Ag, or other suitable electrically conductive material.

An insulating or passivation layer 134 is formed over passivation layer 132 and conductive layer 132. The passivation layer 134 can be SiO2, Si3N4, SiON, Ta2O5, Al2O3, or other material having suitable insulating and structural properties. The passivation layer 134 is patterned or blanket deposited using PVD, CVD, printing, spin coating, sintering, thermal oxidation, or lamination. The passivation layer 134 can be single or multiple layers. A portion of passivation layer 134 is removed by an etching process to expose conductive layers 132.

An electrically conductive solder material is deposited over conductive layer 132 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 136. In some applications, solder bumps 136 are reflowed a second time to improve electrical contact to conductive layer 132. Solder bumps 136 represent one type of interconnect structure that can be formed over conductive layer 132. The interconnect structure can also use bond wires, 3-D interconnects, conductive paste, stud bump, micro bump, or other electrical interconnect.

Figure 6:
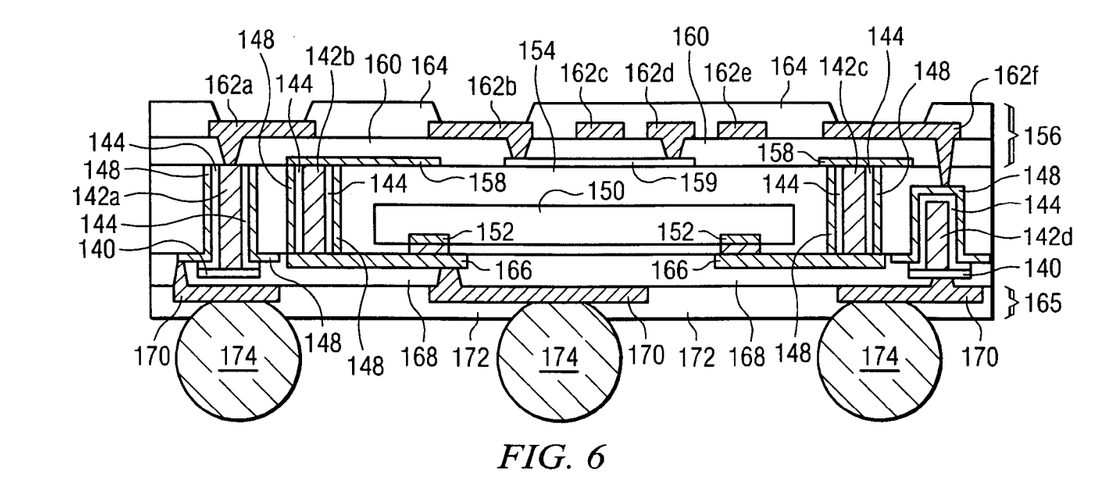
FIG. 6 illustrates an alternate embodiment of the 3-D vertically oriented integrated capacitor in a semiconductor package.

FIG. 6 shows an alternate embodiment of forming 3-D vertically oriented integrated capacitors in a semiconductor package. A seed layer 140 is applied to a temporary carrier with heat or light releasable temporary bonding film, similar to FIG. 3a. Seed layer 140 can be Cu or other metal thin film with wet etching selectivity. Seed layer 140 is deposited using lamination, PVD, CVD, or electrochemical deposition. Seed layer 140 can be temporary bonding film or etch-stop layer.

A plurality of conductive pillars or posts 142a-142d is formed over seed layer 140. A photoresist layer is deposited over seed layer 140. A portion of photoresist layer is exposed and removed by an etching development process. Conductive pillars 142a-142d are formed in the removed portion of photoresist using an electrolytic plating, electroless plating, or selective plating process. Conductive pillars 142 can be Cu, Al, W, Au, solder, or other suitable electrically conductive material. Conductive pillars 142 have a height ranging from 20-200 μm, typical value of 50-100 μm. The photoresist is stripped away leaving behind individual conductive pillars 142a-142d.

A portion of conductive pillars 142d is removed by an etching, grinding, or blade cutting process, similar to FIG. 3b. Conductive pillar 142d is reduced in vertical profile by 20-50 μm after the etching process. The vertical profile of conductive pillars 142a-142c remains unchanged. Alternatively, the different height between 104a-104c and 104d-104e can be carried out by step-lithography and plating process.

A dielectric layer 144 is conformally applied over conductive pillars 142a-142d and seed layer 140, similar to FIG. 3c. The conformal dielectric layer 144 can be SiO2, Si3N4, SiON, Ta2O5, Al2O3, polyimide, BCB, PBO, or other material having insulating properties. The dielectric layer 144 is patterned or blanket deposited using PVD, CVD, printing, spray coating, spin coating, sintering, or thermal oxidation, or lamination. The dielectric layer 144 can be single or multiple layers.

An electrically conductive layer 148 is patterned and conformally deposited over dielectric layer 144. Conductive layer 148 is formed using PVD, CVD, electrolytic plating, electroless plating process, or other suitable metal deposition process. Conductive layer 148 can be one or more layers of Al, Cu, Sn, Ni, Au, Ag, or other suitable electrically conductive material. Note that the vertical profile of conductive pillar 142d with conformal dielectric layer 144 and conductive layer 148 remains less than the vertical profile of conductive pillars 142a-142c with conformal dielectric layer 144 and conductive layer 148.

A semiconductor die 150 is mounted to conductive layer 148 between conductive pillars 142b and 142c, similar to FIG. 3d. Semiconductor die 150 includes analog or digital circuits implemented as active and passive devices, conductive layers, and dielectric layers formed over its active surface and electrically interconnected according to the electrical design of the die. For example, the circuit may include one or more transistors, diodes, and other circuit elements formed within the active surface to implement baseband digital circuits, such as DSP, memory, or other signal processing circuit. The semiconductor die may also contain IPD, such as inductors, capacitors, and resistor, for RF signal processing. In another embodiment, a passive component can be mounted to conductive layer 148 between conductive pillars 142b-142c.

An encapsulant or molding compound 154 is deposited over semiconductor die 150 and conductive layer 148 using a paste printing, compressive molding, transfer molding, liquid encapsulant molding, vacuum lamination, or other suitable applicator, similar to FIG. 3e. Encapsulant 154 can be polymer composite material, such as epoxy resin with filler, epoxy acrylate with filler, or polymer with proper filler. Encapsulant 154 is non-conductive and environmentally protects the semiconductor device from external elements and contaminants.

Figure 7:
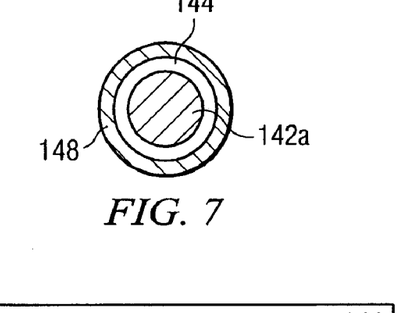
FIG. 7 is a top view of the 3-D vertically oriented integrated capacitor.

A backgrinding process is used to remove a portion of encapsulant 154, conductive layer 148, and dielectric layer 144 to expose a topside of conductive pillars 142a-142c, similar to FIG. 3f. FIG. 7 shows a top view of conductive pillar 142a surrounded by dielectric layer 144 and conductive layer 148. In addition, the temporary carrier is released from seed layer 140 by application of heat or light. Alternatively, the carrier can be removed by chemical etching, mechanical peel-off, CMP, mechanical grinding, thermal bake, laser scanning, plasma etching, or other bulk material thinning process.

Seed layer 140, dielectric layer 144, and conductive layer 148 are selectively removed by an etching process to expose contact pads 152 of semiconductor die 150 and a bottom-side of conductive pillars 142b and 142c. Conductive pillars 142b-142c function a vertical z-interconnects extending from one side of encapsulant 154 to an opposite side of the encapsulant.

Similar to FIG. 4, conductive pillars 142a and 142d operates as a first metal electrode of first and second vertically oriented integrated MIM capacitors. Conductive layer 148 is the second metal electrode of the MIM capacitors. Dielectric layer 144 is the intermediate insulator between the first and second metal electrodes. Conductive layer 148 extends beyond dielectric layer 144 and seed layer 140 for ready interconnect without electrically shorting to conductive pillars 142a and 142d. The MIM capacitors are constructed in 3-D, x- y- and z-directions. The plane parallel to the first and second capacitor electrodes is perpendicular to the plane which is parallel to the active surface of semiconductor die 150. The MIM capacitors extend vertically into encapsulant 154 to save die area and provide greater capacitance density. The MIM capacitors can have a large value for decoupling purposes, without the typical large footprint associated with a high value planar capacitor.

An interconnect structure 156 is formed over encapsulant 154. The interconnect structure 156 includes one or more IPDs. An electrically conductive layer 158 is formed over encapsulant 154, conductive layer 148, and a topside of conductive pillars 142b-142c using a deposition and patterning process to form individual portions or sections. Conductive layer 158 is formed using PVD, CVD, electrolytic plating, electroless plating process, or other suitable metal deposition process. Conductive layer 158 can be one or more layers of Al, Cu, Sn, Ni, Au, Ag, or other suitable electrically conductive material. The individual portions of conductive layer 158 can be electrically common or electrically isolated depending on the design and function of the semiconductor die.

A resistive layer 159 is patterned and deposited over encapsulant 154 using PVD or CVD. Resistive layer 159 is TaxSiy or other metal silicides, TaN, NiCr, TiN, or doped poly-silicon having a resistivity between 5 and 100 ohm/sq.

An insulating or passivation layer 160 is formed over encapsulant 154, conductive layer 158, and resistive layer 159. The passivation layer 160 can be $SiO_2$, $Si_3N_4$, SiON, $Ta_2O_5$, $Al_2O_3$, or other material having suitable insulating and structural properties. The passivation layer 160 is patterned or blanket deposited using PVD, CVD, printing, spin coating, sintering, thermal oxidation, or lamination. The passivation layer 160 can be single or multiple layers. A portion of passivation layer 160 is removed by an etching process to expose conductive layer 148, resistive layer 159, and conductive pillar 142a.

An electrically conductive layer 162 is formed over passivation layer 160, conductive pillar 142a, conductive layer 148, and resistive layer 159 using a patterning and deposition process. Conductive layer 162 includes individual portions or sections 162a-162f. Conductive layer 162 is formed using PVD, CVD, electrolytic plating, electroless plating process, or other suitable metal deposition process. Conductive layer 162 can be one or more layers of Al, Cu, Sn, Ni, Au, Ag, or other suitable electrically conductive material. The individual portions of conductive layer 162 can be electrically common or electrically isolated depending on the design and function of the semiconductor die.

An insulating or passivation layer 164 is formed over passivation layer 160 and conductive layer 162. The passivation layer 164 can be $SiO_2$, $Si_3N_4$, SiON, $Ta_2O_5$, $Al_2O_3$, or other material having suitable insulating and structural properties. The passivation layer 164 is patterned or blanket deposited using PVD, CVD, printing, spin coating, sintering, thermal oxidation, or lamination. The passivation layer 164 can be single or multiple layers. A portion of passivation layer 164 is removed by an etching process to expose conductive layer 162.

Conductive layer 162c-162e constitute one or more IPDs, in this case an inductor. The conductive layer 162c-162e are typically wound or coiled in plan-view to produce or exhibit the desired inductive properties. Conductive layer 162a electrically connects to conductive pillar 142a and semiconductor die 150, and conductive layers 162b and 162d electrically connect to resistive layer 159 as another IPD.

The IPDs formed by conductive layer 162c-162e and resistive layer 159 provide the electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other GSM communications, each balun dedicated for a frequency band of operation of the quad-band device. A typical RF system requires multiple IPDs and other high frequency circuits in one or more semiconductor packages to perform the necessary electrical functions.

The high frequency electrical devices generate or are susceptible to undesired EMI, RFI, or other inter-device interference, such as capacitive, inductive, or conductive coupling, also known as cross-talk. The inductor 142c-142e are vertically separated by encapsulant 154 and offset from semiconductor die 150 to reduce EMI, RFI, and other inter-device interference.

An interconnect structure 165 is formed over encapsulant 154. The interconnect structure 165 electrically connects to conductive pillars 142b-142c, semiconductor die 150, and MIM capacitor 142-148. The interconnect structure 165 includes an electrically conductive layer 166 formed over encapsulant 154, conductive layer 148, and the bottom-side of conductive pillars 142b-142c using a patterning and deposition process. Conductive layer 166 is formed using PVD, CVD, electrolytic plating, electroless plating process, or other suitable metal deposition process. Conductive layer 166 can be one or more layers of Al, Cu, Sn, Ni, Au, Ag, or other suitable electrically conductive material.

An insulating or passivation layer 168 is formed over encapsulant 154, seed layer 140, and conductive layer 166. The passivation layer 168 can be $SiO_2$, $Si_3N_4$, SiON, $Ta_2O_5$, $Al_2O_3$, or other material having suitable insulating and structural properties. The passivation layer 168 is patterned or blanket deposited using PVD, CVD, printing, spin coating, sintering, thermal oxidation, or lamination. The passivation layer 168 can be single or multiple layers. A portion of passivation layer 168 is removed by an etching process to expose conductive layers 148 and 166.

An electrically conductive layer 170 is formed over passivation layer 168 and conductive layer 166 using a patterning and deposition process. Conductive layer 170 is formed using PVD, CVD, electrolytic plating, electroless plating process, or other suitable metal deposition process. Conductive layer 170 can be one or more layers of Al, Cu, Sn, Ni, Au, Ag, or other suitable electrically conductive material.

An insulating or passivation layer 172 is formed over passivation layer 168 and conductive layer 170. The passivation layer 172 can be $SiO_2$, $Si_3N_4$, SiON, $Ta_2O_5$, $Al_2O_3$, or other material having suitable insulating and structural properties. The passivation layer 172 is patterned or blanket deposited using PVD, CVD, printing, spin coating, sintering, thermal oxidation, or lamination. The passivation layer 172 can be single or multiple layers. A portion of passivation layer 172 is removed by an etching process to expose conductive layers 170.

An electrically conductive solder material is deposited over conductive layer 170 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 174. In some applications, solder bumps 174 are reflowed a second time to improve electrical contact to conductive layer 170. Solder bumps 174 represent one type of interconnect structure that can be formed over conductive layer 170. The interconnect structure can also use bond wires, 3-D interconnects, conductive paste, stud bump, micro bump, or other electrical interconnect.

Figure 8:
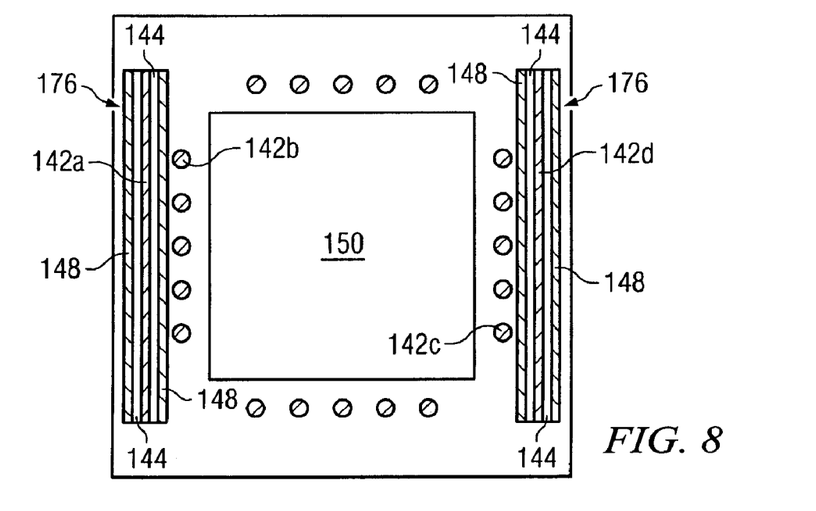
FIG. 8 is a top view of the semiconductor package with the 3-D vertically oriented integrated capacitor.

FIG. 8 is a top view of semiconductor die 150 with 3-D vertically oriented integrated capacitors formed along the sides of the die. Conductive pillars 142b and 142c provides z-direction interconnect. Conductive pillars 142a and 142d operates as a first metal electrode of first and second vertically oriented integrated MIM capacitors 176. Conductive layer 148 is the second metal electrode of MIM capacitors 176. Dielectric layer 144 is the intermediate insulator between the first and second metal electrodes.

Figure 9:
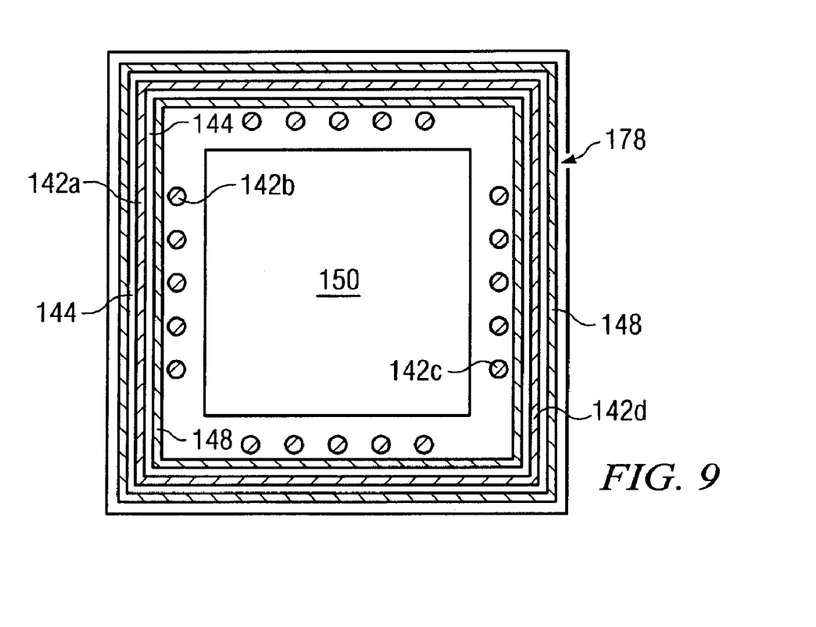
FIG. 9 is a top view of the semiconductor package with another embodiment of the 3-D vertically oriented integrated capacitor.

FIG. 9 is a top view of semiconductor die 150 with a 3-D vertically oriented integrated capacitor formed around the die. Conductive pillars 142b and 142c provides z-direction interconnect. Conductive pillars 142 operate as a first metal electrode of the vertically oriented integrated MIM capacitor 178. Conductive layer 148 is the second metal electrode of MIM capacitor 178. Dielectric layer 144 is the intermediate insulator between the first and second metal electrodes.

Figure 10:
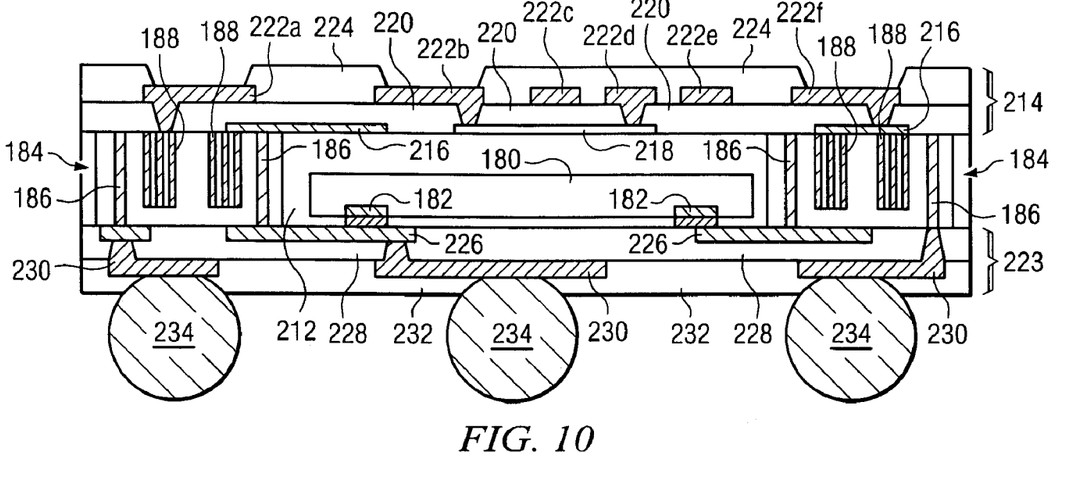
FIG. 10 illustrates the 3-D vertically oriented integrated capacitor in a silicon interposer.

A semiconductor die 180 with another 3-D vertically oriented integrated capacitor configuration is shown in FIG. 10. Semiconductor die 180 includes analog or digital circuits implemented as active and passive devices, conductive layers, and dielectric layers formed over its active surface and electrically interconnected according to the electrical design of the die. For example, the circuit may include one or more transistors, diodes, and other circuit elements formed within the active surface to implement baseband digital circuits, such as DSP, memory, or other signal processing circuit. The semiconductor die may also contain IPD, such as inductors, capacitors, and resistor, for RF signal processing.

Figure 11:
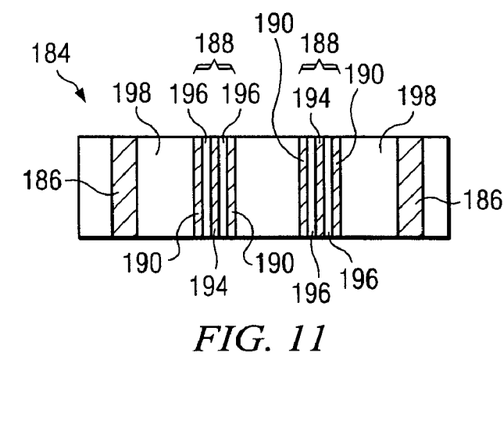
FIG. 11 illustrates further detail of the silicon interposer with 3-D capacitor and conductive pillars.

Silicon interposers 184 are placed on each side of semiconductor die 180. Each silicon interposer 184 includes conductive pillars 186 and 3-D vertically oriented integrated capacitors 188. Further detail of silicon interposer 184 is shown in FIG. 11. Conductive pillars 186 function on vertical z-interconnects extending from one side of the silicon interposer to an opposite side of the device. Each 3-D vertically oriented integrated MIM capacitor 188 includes outer conductive layer 190 and inner conductive layer 194. A dielectric layer 196 is disposed between conductive layers 190 and 194. Conductive layer 194 operates as a first metal electrode of the MIM capacitor. Conductive layer 190 is the second metal electrode of the MIM capacitor. Dielectric layer 196 is the intermediate insulator between the first and second metal electrodes. Silicon material 198 is formed around conductive layers 190 and 194 and dielectric layer 196.

Figure 12:
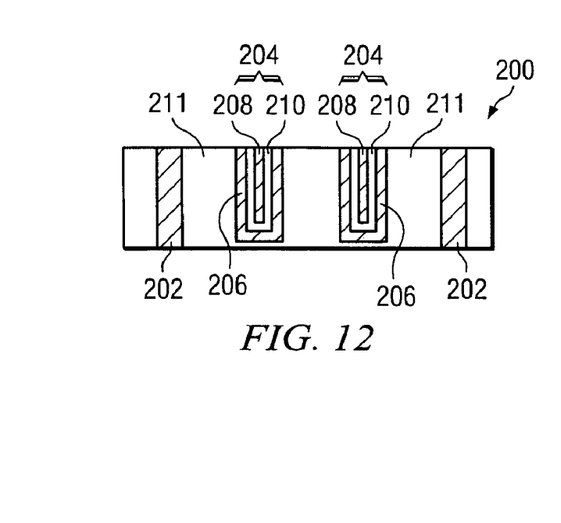
FIG. 12 illustrates another embodiment of the silicon interposer with 3-D capacitor and conductive pillars.

Another interposer structure 200 is shown in FIG. 12. Conductive pillars 202 function as vertical z-interconnects extending from one side of the silicon interposer to an opposite side of the device. Each 3-D vertically oriented integrated MIM capacitor 204 includes outer conductive layer 206 and inner conductive layer 208. A dielectric layer 210 is disposed between conductive layers 206 and 208. Conductive layer 206 operates as a first metal electrode of the MIM capacitor. Conductive layer 208 is the second metal electrode of the MIM capacitor. Dielectric layer 210 is the intermediate insulator between the first and second metal electrodes. Silicon material 211 is formed around conductive layers 206 and 208 and dielectric layer 210.

Returning to FIG. 10, an encapsulant or molding compound 212 is deposited over semiconductor die 180 and silicon interposers 184 using a paste printing, compressive molding, transfer molding, liquid encapsulant molding, vacuum lamination, or other suitable applicator. Encapsulant 212 can be polymer composite material, such as epoxy resin with filler, epoxy acrylate with filler, or polymer with proper filler. Encapsulant 212 is non-conductive and environmentally protects the semiconductor device from external elements and contaminants.

An interconnect structure 214 is formed over encapsulant 212. The interconnect structure 214 includes one or more IPDs. An electrically conductive layer 216 is formed over encapsulant 212 and silicon interposer 184 using a deposition and patterning process to form individual portions or sections. Conductive layer 216 is formed using PVD, CVD, electrolytic plating, electroless plating process, or other suitable metal deposition process. Conductive layer 216 can be one or more layers of Al, Cu, Sn, Ni, Au, Ag, or other suitable electrically conductive material. The individual portions of conductive layer 216 can be electrically common or electrically isolated depending on the design and function of the semiconductor die.

A resistive layer 218 is patterned and deposited over encapsulant 212 using PVD or CVD. Resistive layer 218 is TaxSiy or other metal silicides, TaN, NiCr, TiN, or doped poly-silicon having a resistivity between 5 and 100 ohm/sq.

An insulating or passivation layer 220 is formed over encapsulant 212, silicon interposer 184, conductive layer 216, and resistive layer 218. The passivation layer 220 can be SiO2, Si3N4, SiON, Ta2O5, Al2O3, or other material having suitable insulating and structural properties. The passivation layer 220 is patterned or blanket deposited using PVD, CVD, printing, spin coating, sintering, thermal oxidation, or lamination. The passivation layer 220 can be single or multiple layers. A portion of passivation layer 220 is removed by an etching process to expose silicon interposer 184, conductive layer 216, and resistive layer 218.

An electrically conductive layer 222 is formed over passivation layer 220, silicon interposer 184, conductive layer 216, and resistive layer 218 using a patterning and deposition process. Conductive layer 222 includes individual portions or sections 222a-222f. Conductive layer 222 is formed using PVD, CVD, electrolytic plating, electroless plating process, or other suitable metal deposition process. Conductive layer 222 can be one or more layers of Al, Cu, Sn, Ni, Au, Ag, or other suitable electrically conductive material. The individual portions of conductive layer 222 can be electrically common or electrically isolated depending on the design and function of the semiconductor die.

An insulating or passivation layer 224 is formed over passivation layer 220 and conductive layer 222. The passivation layer 224 can be SiO2, Si3N4, SiON, Ta2O5, Al2O3, or other material having suitable insulating and structural properties. The passivation layer 224 is patterned or blanket deposited using PVD, CVD, printing, spin coating, sintering, thermal oxidation, or lamination. The passivation layer 224 can be single or multiple layers. A portion of passivation layer 224 is removed by an etching process to expose conductive layer 222.

Conductive layers 222c-222e constitute one or more IPDs, in this case an inductor. The conductive layers 222c-222e are typically wound or coiled in plan-view to produce or exhibit the desired inductive properties. Conductive layer 222a electrically connects to MIM capacitor 188 and semiconductor die 180, and conductive layer 222b and 222d electrically connect to resistive layer 218 as another IPD.

The IPDs formed by conductive layers 222c-222e and resistive layer 218 provide the electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other GSM communications, each balun dedicated for a frequency band of operation of the quad-band device. A typical RF system requires multiple IPDs and other high frequency circuits in one or more semiconductor packages to perform the necessary electrical functions.

An interconnect structure 223 is formed over encapsulant 212. The interconnect structure 223 electrically connects to conductive pillars 186, semiconductor die 180, and MIM capacitor 188. The interconnect structure 223 includes an electrically conductive layer 226 formed over encapsulant 212 and silicon interposer 184 using a patterning and deposition process. Conductive layer 226 is formed using PVD, CVD, electrolytic plating, electroless plating process, or other suitable metal deposition process. Conductive layer 226 can be one or more layers of Al, Cu, Sn, Ni, Au, Ag, or other suitable electrically conductive material.

An insulating or passivation layer 228 is formed over encapsulant 212, silicon interposer 184, and conductive layer 226. The passivation layer 228 can be SiO2, Si3N4, SiON, Ta2O5, Al2O3, or other material having suitable insulating and structural properties. The passivation layer 228 is patterned or blanket deposited using PVD, CVD, printing, spin coating, sintering, thermal oxidation, or lamination. The passivation layer 228 can be single or multiple layers. A portion of passivation layer 228 is removed by an etching process to expose conductive layers 186 and 226.

An electrically conductive layer 230 is formed over passivation layer 228 and conductive layer 226 using a patterning and deposition process. Conductive layer 230 is formed using PVD, CVD, electrolytic plating, electroless plating process, or other suitable metal deposition process. Conductive layer 230 can be one or more layers of Al, Cu, Sn, Ni, Au, Ag, or other suitable electrically conductive material.

An insulating or passivation layer 232 is formed over passivation layer 228 and conductive layer 230. The passivation layer 232 can be SiO2, Si3N4, SiON, Ta2O5, Al2O3, or other material having suitable insulating and structural properties. The passivation layer 232 is patterned or blanket deposited using PVD, CVD, printing, spin coating, sintering, thermal oxidation, or lamination. The passivation layer 232 can be single or multiple layers. A portion of passivation layer 232 is removed by an etching process to expose conductive layers 230.

An electrically conductive solder material is deposited over conductive layer 230 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 234. In some applications, solder bumps 234 are reflowed a second time to improve electrical contact to conductive layer 230. Solder bumps 234 represent one type of interconnect structure that can be formed over conductive layer 230. The interconnect structure can also use bond wires, 3-D interconnects, conductive paste, stud bump, micro bump, or other electrical interconnect.

Figure 13:
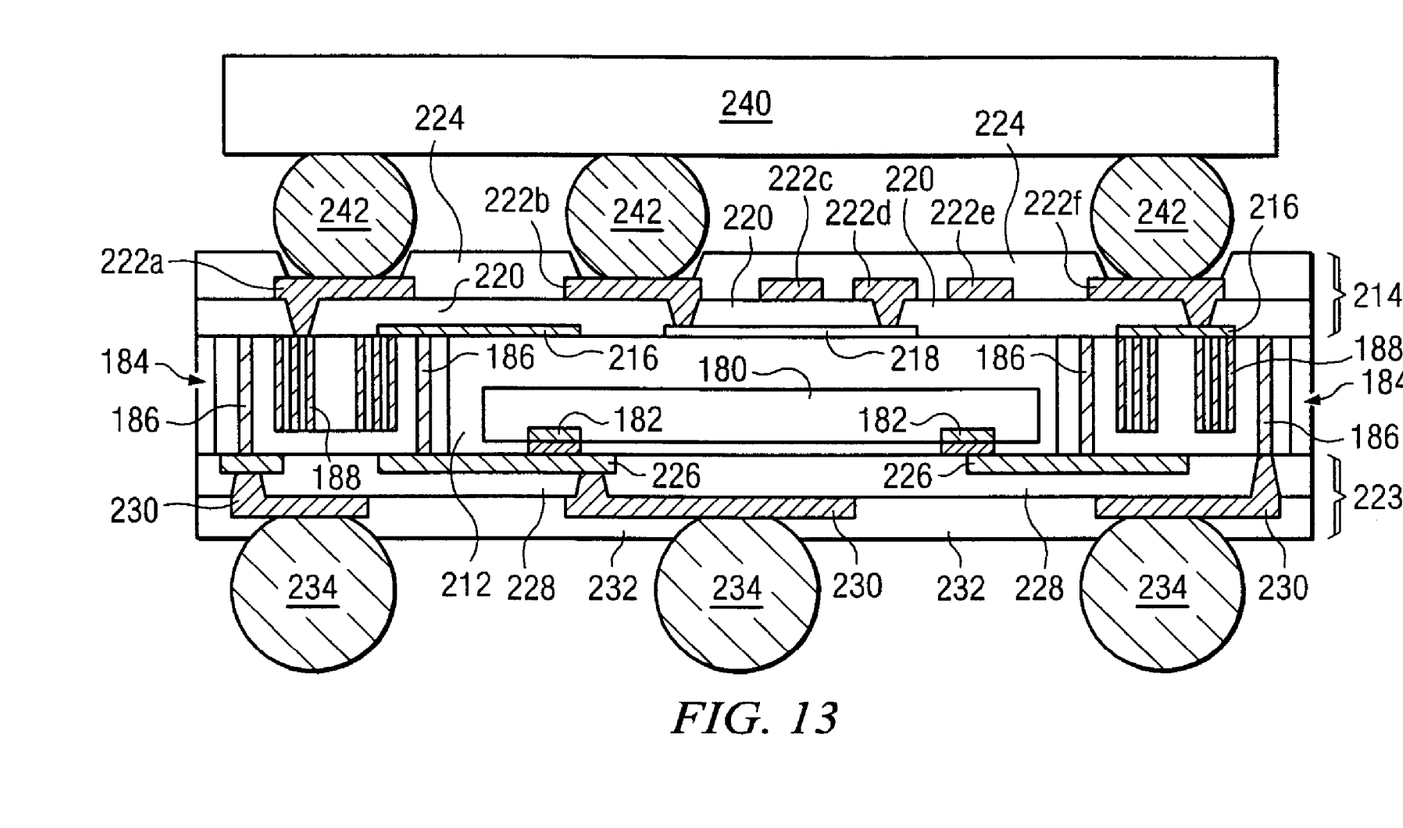
FIG. 13 illustrates a flip chip type semiconductor die mounted to the topside interconnect structure of FIG. 10.

FIG. 13 shows a flip chip type semiconductor die 240 with solder bumps 242 mounted to a top surface of conductive layer 222a, 222b, and 222f in interconnect structure 214. Semiconductor die 240 electrically connects to integrated capacitors 188, conductive pillars 186, interconnect structure 223, and semiconductor die 180. A flip chip type semiconductor die like 240 can also be mounted to a top surface of conductive layer 124a, 124f, and 124g in interconnect structure 117 in FIG. 5, and conductive layer 162a, 162b and 162f in interconnect structure 156 in FIG. 6.

While one or more embodiments of the present invention have been illustrated in detail, the skilled artisan will appreciate that modifications and adaptations to those embodiments may be made without departing from the scope of the present invention as set forth in the following claims.

What is claimed:
1. A method of making a semiconductor device, comprising:
   providing a temporary carrier;
   depositing a seed layer over the temporary carrier;
   forming a plurality of conductive pillars vertically over the seed layer;
   forming a conformal insulating layer over the conductive pillars;
   forming a conformal conductive layer over the conformal insulating layer, wherein a first conductive pillar, conformal insulating layer, and conformal conductive layer constitute a vertically oriented integrated capacitor;
   mounting a semiconductor die or component over the seed layer;
   depositing an encapsulant over the semiconductor die or component and around the conformal conductive layer;
   forming a first interconnect structure over a first side of the encapsulant, the first interconnect structure being electrically connected to a second conductive pillar;
   removing the temporary carrier; and
   forming a second interconnect structure over a second side of the encapsulant opposite the first side of the encapsulant.

2. The method of claim 1, wherein the first interconnect structure includes an integrated passive device.

3. The method of claim 1, further including removing a portion of the first conductive pillar prior to forming the conformal insulating layer.

4. The method of claim 1, wherein forming the first interconnect structure includes:
   forming a first conductive layer over the encapsulant, the first conductive layer being electrically connected to the second conductive pillar;
   forming a first insulating layer over the encapsulant and first conductive layer;
   forming a second conductive layer over the first insulating layer and first conductive layer; and
   forming a second insulating layer over the first insulating layer and second conductive layer.

5. The method of claim 1, further including removing a portion of the conformal conductive layer and conformal insulating layer from the first conductive pillar.

6. The method of claim 1, further including mounting a second semiconductor die to the first interconnect structure.

7. A method of making a semiconductor device, comprising:
   providing a carrier;

forming a plurality of conductive pillars vertically over the carrier;

forming a conformal insulating layer over the conductive pillars;

forming a conformal conductive layer over the conformal insulating layer, wherein a first conductive pillar, conformal insulating layer, and conformal conductive layer constitute a vertically oriented integrated capacitor;

mounting a semiconductor die or component over the carrier;

depositing an encapsulant over the semiconductor die or component and around the conformal conductive layer; and forming a first interconnect structure over a first side of the encapsulant, the first interconnect structure being electrically connected to the semiconductor die or component and vertically oriented integrated capacitor.

8. The method of claim 7, wherein the first interconnect structure is electrically connected to a second conductive pillar.

9. The method of claim 8, wherein forming the first interconnect structure includes:

forming a first conductive layer over the encapsulant, the first conductive layer being electrically connected to the second conductive pillar;

forming a first insulating layer over the encapsulant and first conductive layer;

forming a second conductive layer over the first insulating layer and first conductive layer; and forming a second insulating layer over the first insulating layer and second conductive layer.

10. The method of claim 8, further including removing a portion of the conformal conductive layer and conformal insulating layer from the first conductive pillar.

11. The method of claim 7, further including forming a second interconnect structure over a second side of the encapsulant opposite the first side of the encapsulant.

12. The method of claim 7, wherein the first interconnect structure includes an integrated passive device.

13. The method of claim 7, further including mounting a second semiconductor die to the first interconnect structure.

14. The method of claim 13, wherein the second semiconductor die is a flip chip type semiconductor die.

15. A method of making a semiconductor device, comprising:

providing a carrier;

forming a conductive pillar over the carrier;

forming a conformal insulating layer over the conductive pillar;

forming a conformal conductive layer over the conformal insulating layer, wherein the conductive pillar, conformal insulating layer, and conformal conductive layer constitute a vertically oriented integrated capacitor;

mounting a semiconductor die or component over the carrier; and depositing an encapsulant over the semiconductor die or component and around the vertically oriented integrated capacitor.

16. The method of claim 15, further including:

forming a first interconnect structure over a first side of the encapsulant, the first interconnect structure being electrically connected to the semiconductor die or component and vertically oriented integrated capacitor; and forming a second interconnect structure over a second side of the encapsulant opposite the first side of the encapsulant.

17. The method of claim 16, wherein the first interconnect structure includes an integrated passive device.

18. The method of claim 16, further including mounting a second semiconductor die to the first interconnect structure.

19. The method of claim 18, wherein the second semiconductor die is a flip chip type semiconductor die.

20. A method of making a semiconductor device, comprising:

providing a carrier;

mounting a semiconductor die or component over the carrier;

disposing a vertically oriented integrated metal-insulator-metal (MIM) capacitor over the carrier, wherein an active surface of the semiconductor die or component is perpendicular to a first electrode and a second electrode of the vertically oriented integrated MIM capacitor; and depositing an encapsulant over the semiconductor die or component and around the vertically oriented integrated MIM capacitor.

21. The method of claim 20, wherein disposing the vertically oriented integrated metal-insulator-metal (MIM) capacitor over the carrier comprises depositing a conductive pillar over the carrier to form the first electrode, the conductive pillar having a cross-section in a plane that is perpendicular to the active surface of the semiconductor die or component, a height of the cross-section greater than a width of the cross-section.

22. The method of claim 21, wherein disposing the vertically oriented integrated metal-insulator-metal (MIM) capacitor over the carrier further comprises depositing a conformal conductive layer over the conductive pillar to form the second electrode.

23. The method of claim 22, wherein disposing the vertically oriented integrated metal-insulator-metal (MIM) capacitor over the carrier further comprises depositing a conformal insulating layer between the conductive pillar and the conformal conductive layer.

24. The method of claim 20, further comprising:

forming a first interconnect structure over a first side of the encapsulant, the first interconnect structure being electrically connected to the semiconductor die or component and the vertically oriented integrated MIM capacitor; and forming a second interconnect structure over a second side of the encapsulant opposite the first side of the encapsulant.

* * * * *